United States Patent [19]
Hedlund et al.

[11] Patent Number: 5,812,563
[45] Date of Patent: Sep. 22, 1998

[54] CIRCUIT BOARD TESTING

[75] Inventors: Mikael Hedlund, Mölndal; Hans Högberg, Kumla, both of Sweden

[73] Assignee: Telefonaktiebolaget LM Ericsson, Stockholm, Sweden

[21] Appl. No.: 883,904

[22] Filed: Jun. 27, 1997

[30] Foreign Application Priority Data

Jun. 28, 1996 [SE] Sweden ................................. 9602564

[51] Int. Cl.⁶ ...................................................... G06F 11/00
[52] U.S. Cl. .......................................................... 371/27.1
[58] Field of Search ................................. 371/27.1, 27.3, 371/27.5, 28, 22.1; 324/73 R, 73 AI

[56] References Cited

U.S. PATENT DOCUMENTS 4,176,780 12/1979 Sacher et al. .
4,194,113 3/1980 Fulks et al. .

FOREIGN PATENT DOCUMENTS 239 251 9/1987 European Pat. Off. .
527 321 2/1993 European Pat. Off. .

Primary Examiner—Vincent P. Canney
Attorney, Agent, or Firm—Burns, Doane, Swecker & Mathis, L.L.P.

[57] ABSTRACT

A method and arrangement for testing circuit boards (60) by creating one or several reference patterns to be compared with a test pattern. The arrangement is provided with at least one measuring probe (50), which cooperates with the circuit board (60), for measuring at least one reference signal or test signal on a reference circuit board and a test circuit board (60) respectively. Further, the arrangement is provided with an analyzer (10,30), which cooperates with the measuring probe (50), to pass on the reference signal or the test signal, whereby the analyzer (10,30) first analyzes the reference signal or the test signal at one frequency and then transforms the reference signal or the test signal to a reference pattern and test pattern respectively. Furthermore, the arrangement is provided with at least one memory (20) which cooperates with said analyzer (10,30) to register said reference pattern or test pattern. The memory (20) is provided with two or several reference patterns when testing a circuit board (60).

13 Claims, 3 Drawing Sheets

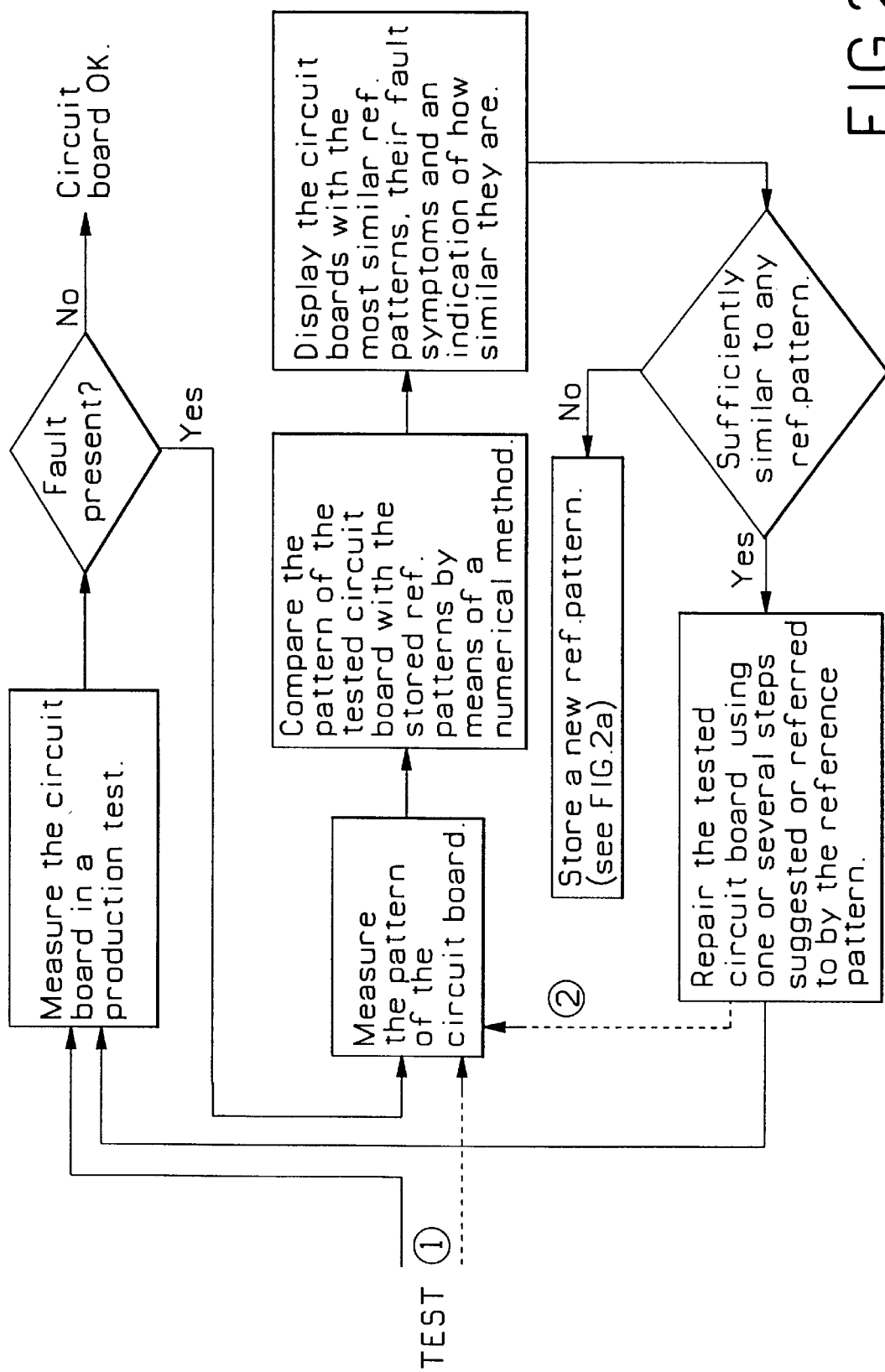

CIRCUIT BOARD TESTING

TECHNICAL FIELD

The present invention relates to a method and an arrangement for testing circuit boards by means of signature analysis.

BACKGROUND OF THE INVENTION

Those systems which are predominantly used by the circuit board industry at present in order to test circuit boards generally consist of a measurement arrangement which comprises a signal processor/analyzer and a fixture. The fixture can consist of a box equipped with connections to the signal processor and with sockets for inserting one or several types of circuit boards. Beneath this socket there are a number of measuring organs, for example in the form of gold-plated contacts intended to be pressed, for example using compressed air, against selected measuring points on a circuit board.

The results which are displayed by the signal processor are very varying, depending on, for example, the application and how a producer has chosen to display the results. Generally, a long learning time is necessary in order to use this arrangement, since those faults which are indicated can depend on a large amount of factors which do not necessarily need to be associated with the faults which have been indicated, since those faults which have been indicated can be a consequence of the real fault. Furthermore, the fault indications are so difficult to interpret that assistance by a very experienced operator is usually necessary.

Other problems which can arise in such systems are in the fixtures, where contact problems and/or leakage currents can occur between the circuit board and the contact. This can be caused by bending of the contact, by oxidizing of the contact, or by the fixture not being sufficiently sealed so that a desired underpressure is not created when the contacts are intended to be pressed up, for example using compressed air, against the circuit board.

In order to solve these problems, the measuring organ can consist of one or several antennas or probes which measure an electromagnetic field around one or several components. This kind of measurement is usually called near-field measurement. In order to measure these electromagnetic fields, an antenna can be utilized which is arranged close to the measurement object. The signals which are detected by the antenna can be processed in some kind of processing unit. This processing unit can for example be a spectrum analyzer and an arrangement for analysis of the measurement results. The results which are obtained from the measurements can be in the shape of frequency characteristics, either for the entire circuit board or for separate components, and this result can for example be utilized in order to decide whether a circuit board is functioning or not, but also to decide how sensitive the board is to ambient electrical fields (EMC-measurement). On a circuit board there can be a number of components which radiate signals which vary in time, where each and every one of these components induces an electromagnetic field. If a fault occurs in any component on this circuit board, the electromagnetic field will also change.

A method for measuring electromagnetic radiation from circuit boards is shown in EP-A-0,239,251. The radiation is in this case measured by means of a matrix of measurement probes which successively address and measure the currents which are induced in the probes in a receiver. A signature is generated of the electromagnetic radiation as a function of a position on a circuit board and is shown together with the layout of the circuit board. By comparing the signature which has been generated in the test in question with the reference signature of a functioning circuit board, areas with anomalies in radiation can be identified, i.e. the position and possibly the cause of a possible fault is identified in this manner. However, this solution only comprises a comparison with a reference signature, which might mean that it is not always possible to find the real fault. EP-A-0,239,251 furthermore appears to use absolute comparisons of signatures, which can be very time consuming.

A solution which shows how faults in circuit boards can be located by comparing a test signature with a reference signature is shown in U.S. Pat. No. 4,176,780. Both the test and reference signatures are generated in a test program and are in the form of binary tables, with either a one or a zero indicating the condition for a certain step in the test program. A possible fault in the circuit board can be located since the signature of the circuit board which is tested deviates from the reference signature at the corresponding step in the test program, following which the fault is then isolated recursively. This can however cause very long waiting times if a fault is found, since the test program has to find the point where the fault is by isolating the fault recursively. Furthermore U.S. Pat. No. 4,176,780 appears to use absolute comparisons of signatures, which can be very time consuming.

Another solution which shows how faults in a circuit board can be located by comparing a test signature with a reference signature is shown in U.S. Pat. No. 4,194,113. This solution appears to be similar to that of U.S. Pat. No. 4,176,780.

SUMMARY OF THE INVENTION

It is thus an object of the present invention to provide a method and an arrangement for reducing the waiting time when testing circuit boards, for example when isolating faults.

A further object of the present invention is to provide a method and an arrangement to facilitate analysis of the cause of a fault.

A further object of the present invention is to provide a result which is easy to interpret.

A further object of the present invention is to provide increased precision in measurements in a circuit board test.

Another object of the present invention is to provide a system which eliminates contact problems which might occur between a circuit board and a measuring probe.

Another object of the present invention is that signals which are measured during a circuit board test are dynamical i.e. the signals are not associated to any logical levels, for example 1 or 0.

In accordance with the present invention, these above-mentioned objects are achieved by providing a method and an arrangement for testing circuit boards which can measure signals on a circuit board. The test is based on i.a. comparisons between test boards and previously measured reference boards. In order to make a quick measurement, the comparison can be done relative, for example by a suitable estimate. The signals do not need to be associated to any logical conditions but can be dynamical.

In order to obtain a reference pattern of the reference board, one or several reference signals are measured on the reference circuit board by means of one or several measuring probes. Subsequently, the reference signal can be transmitted from the measuring probe to an analyzer, which analyzer first analyzes the reference signal at one or several frequencies and then converts the reference signal to a reference pattern. Following this the reference pattern can be stored in a memory.

In order to obtain a test pattern of the test board, one or several test signals are measured on the test board by means of one or several measuring probes. These test signals can subsequently be sent to an analyzer which analyzer first analyzes the test signal at one or several frequencies, and then converts the test signal to a test pattern. The test pattern can then be compared with one or several reference patterns which have been stored in a memory. If several reference patterns are stored in the memory, it might be preferable to make the comparison in a certain sequence, for example by letting the comparison start with those reference patterns which are the most frequent. A result can also be obtained iteratively, i.e. by repeating a test with the subsequent reference pattern one or several times.

Furthermore, the above-mentioned objects are obtained by providing a memory with information regarding previously measured patterns, where the information can comprise for example causes and symptoms of faults.

In order to increase the precision of the measurement, the signals can be measured at several different frequencies. Furthermore the measurement can be done by means of field probes, i.e. probes which are not in galvanic contact with the circuit board, which eliminates contact problems.

DESCRIPTION OF THE FIGURES

The invention will be described in more detail below, where preferred embodiments are show by way of example with reference to the appended drawings in which.

PREFERRED EMBODIMENTS

Figure 1:
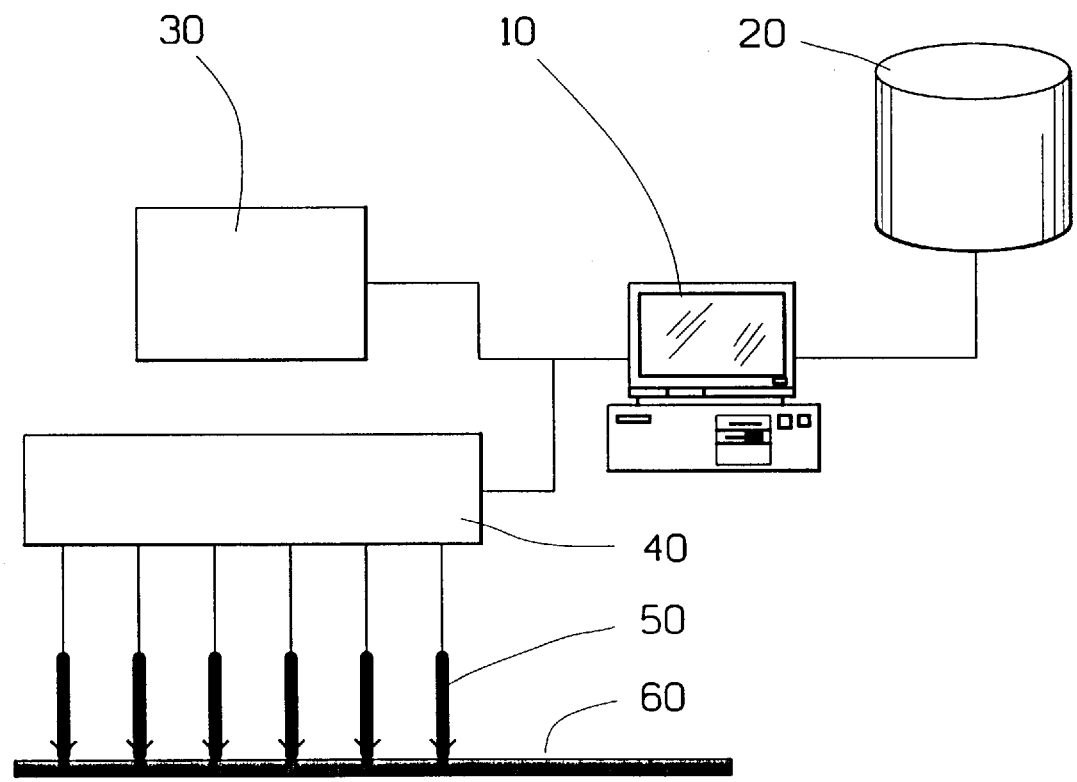
FIG. 1 shows a sketch of the principle of a circuit board tester according to the present invention, and FIGS. 2A and B show a flow-chart of a method according to the present invention.

With reference to FIG. 1, a measuring arrangement in accordance with the present invention is shown, in which a fixture 40 is equipped with one or several fixed or mobile measuring probes 50, which for example can measure the electromagnetic field, the electrical E-field and/or the magnetic H-field, suitably the E- or the H-field, preferably the E-field over one or several components on a circuit board 60. In the following, reference will be made to the electrical E-field, which however can be expanded according to the above. The measuring is done without galvanic contact against the circuit board 60 which is to be measured, for example by means of field probes. The measuring can of course be made by means of galvanic measuring probes, or a combination of both field probes and galvanic probes. When measuring weak signals and/or signals at low frequencies, it can be advantageous if the measurement is made by means of galvanically contacting probes. The probes 50 can scan the entire board 60 by being moved continuously across the entire board 60, in order to measure the emission (E-field) which is radiated by the board 60. Instead of measuring the E-field, for example current and/or voltage can be measured on the circuit board 60 by the measuring probes 50 being in galvanic contact with measuring points on the circuit board 60. The fixture 40 can be connected to a measuring instrument such as a spectrum analyzer 30, in order to receive, analyze signals in for example a frequency plane, and transmit the signals which are obtained from the circuit board 60 at different frequencies. Subsequently, said signals can be converted after the spectrum analyzer 30 has transmitted the signals where the information which is obtained from the spectrum analyzer 30 can be further processed in an arrangement for signal processing 10, for example by means of a computer of the PC type, which in a simple manner analyzes the condition of the circuit board by using a pattern recognition method which will be described in more detail below in this description with reference to FIG. 2. Other kinds of measuring instruments than a spectrum analyzer can of course be used, an oscilloscope can for example be used to examine signals in the time plane instead of in the frequency plane. Another kind of measuring instrument can be a frequency selective measuring receiver. Furthermore, the signals do not need to be associated to any logical conditions but can be dynamical.

In order to convert the signals from the spectrum analyzer to the computer, an interface can be connected between the spectrum analyzer and the computer, where the interface for example can be of the GPIB-kind (General Purpose Interface Bus). The computer 10 can furthermore be connected to a printer (not shown) which enables the printing of different conditions of the circuit board 60 which is intended to be measured.

Manufacturing a measuring probe 50 to measure an E-field is very simple and inexpensive. Designing a probe from a coaxial cable is for example an excellent solution. It is for example possible to use a 50 ohm cable with an outer conductor of aluminum or copper, an inner conductor with a diameter of approximately 0,1–1,0 mm, preferably 0,3–0,6 mm, where the outer conductor has a diameter of approximately 0,5–2,0 mm, preferably 0,9–1,6 mm. Other probes which have a high reliability can be a microwave contact, for example a Huber & Suhner (trademark) 23 SMA-50-0-3, and where a dielectrical material on the contact can be covered with copper, aluminum or other suitable materials. The dielectrical material on the microwave contact can be of a varying length of approximately 1–10 mm, preferably between 1,8–4,1 mm. Naturally the probe does not need to be a Huber & Suhner (trademark) 23 SMA-50-0-3, but can be a microwave contact of another kind.

In those cases where the probes 50 are mobile, they can be moved, using for example an engine and guide rails, to a desired position on the circuit board 60, be fixed in this position and carry out the intended measurement, i.e. the probe does not scan across the circuit board 60.

The analysis of the condition of the circuit board 60 can be carried out by storing the signals in question in one or several memories 20, and by comparing them with one or several reference signals which are already stored in another or in the same memory 20 in connection to said computer 10. The different signals can be stored in the memory 20, for example in the shape of matrixes. Subsequently, a result can be obtained quickly and easily, for example by means of a point estimate method such as the method of least squares, or another suitable method of approximation, i.e. by making the comparisons relative.

Assume a matrix $M_{ref}$ which symbolizes a reference pattern, and a matrix $M_{means}$ which symbolizes a test pattern. By subtracting $M_{ref}$ from $M_{means}$ a difference matrix $M_{diff}$ is obtained, in which each element corresponds to the difference in signal level at a certain position and at a certain frequency. Subsequently, the absolute value of each element in the difference matrix is squared and summed. Instead of being squared, each element can be raised to an exponent n, where $n \neq 0$ and does not need to be an integer (which can be larger or smaller than 2). Finally, the amount of elements N is divided by the raised and summed result, in order to obtain a normalisation or a so-called mean square deviation (when squaring). A squared value is calculated for each reference pattern from a data base, i.e. the memory 20, and the smallest value thus constitutes the most similar signal pattern. Symbolically this calculation can be expressed as:

$$\frac{1}{N} \Sigma (M_{meas} - M_{ref})^2$$

where the matrixes are multiplied element by element.

If the variance in these calculations is too large, which can be caused by for example noise or other interferences, a masking matrix $M_{mask}$ can be used. The values which are included in the comparisons are indicated by for example a "1", and the values which have been excluded from the comparison are indicated by for example "0". Depending on the reference pattern, the masking matrix $M_{mask}$ can be adapted to the respective reference patterns. Symbolically this can be expressed as:

$$\frac{1}{N} \Sigma M_{mask}(M_{meas} - M_{ref})^2$$

where the multiplication of the matrixes is done element by element.

In order to improve the significance of the pattern comparisons a weighting matrix $M_{weig}$ can be used. Values with a small variance can thus be weighted with values larger than for example 1, and values with a large variance can thus be weighted with values smaller than for example 1.

Depending on the reference pattern, the weighting matrix $M_{weig}$ can be adapted to the respective reference patterns. Symbolically this can be expressed as:

$$\frac{1}{N} \Sigma M_{weig} M_{mask}(M_{meas} - M_{ref})^2$$

where the matrixes are multiplied element by element.

In some cases it can be preferable to increase the importance of certain strategic measuring points, and/or decrease or completely eliminate the importance of other measuring points when comparing patterns. This is due to the fact that certain measuring points are of greater importance, since they provide more information than others, since the magnitude of the measured signals at these strategic measuring points vary greatly depending on the fault in the circuit board. Such an increase of the importance of certain strategic measuring points is covered by the masking matrix $M_{mask}$ and/or the weighting matrix $M_{weig}$. This calculation can also be carried out without the masking matrix $M_{mask}$ if the variance is not too great. Naturally, other estimates than the method of least squares can be used, for example the maximum likelihood method can also be applied in this case if the distribution across the values is known.

The result of the comparisons can then be displayed graphically, where the comparisons can consist of differences in levels of the different measuring points at different frequencies, for example by showing the different levels in two dimensional histograms or the like. Other kinds of diagrams are also possible, for example three-dimensional field diagrams or contour diagrams of these, where the differences have been indicated using different colours or blacking. The results are preferably displayed numerically, where the numerical result indicates which reference board/boards the tested board is the most similar to, and the degree of similarity between the tested board and the reference board/boards. The probable cause and symptom of the faults of the circuit board can be displayed together with this result.

The reference signals which have been stored in the memory are the results of the previous measurements. In order to analyze which fault has occurred in a circuit board, one or several measurements have been made previously on one or several circuit boards which were functioning, or in which certain components at different points in time and frequencies intentionally or unintentionally were out of function or had been removed. In this way a circuit board can thus be analyzed, since the pattern which is on the circuit board completely or partially fits one of the patterns which have been stored previously in one of the memories of the computer, and the operator thus only needs to read the result which is obtained subsequent to this pattern recognition method in order to decide whether the board is functional or which components are missing or are out of function.

In order to create a reference pattern, a measurement can thus be made of one or several reference signals on one or several reference circuit boards 60 by means of a fixture 40 equipped with one or several measuring probes 50 which is connected to said circuit board 60. The reference signal can subsequently be transmitted, by means of said measuring probes 50, to an analyzer 10,30 which said analyzer 10,30 first analyzes said reference signal at one frequency, and then converts said reference signal to a reference pattern. The analyzer 10,30 in this case, for reasons of simplicity, consists both of a spectrum analyzer 30, a GPIB interface (not shown) and a computer 10. The reference pattern is registered in one or several memories 20, which are connected to said analyzer 10,30. The memory 20 can be connected either internally or externally in connection to or on the analyzer 10,30. In order to obtain more than one reference patterns, this measurement is repeated on different reference cards 60, and several reference patterns are obtained, which are registered in the memory 20. The memory can furthermore contain information regarding the condition of the circuit board 60 which has been registered at other points in time, e.g. manually or automatically, i.e. registered by an operator or interpreted independently by the analyzer 10,30 by means of a program for fault analysis. The information regarding the condition of the reference circuit board 60 which for example comprises the cause and/or the symptom of a fault in the reference circuit board 60 can be stored externally with regards to the memory if said memory can address the information. The information is thus part of the memory. The information can for example be stored on paper. The signals which have been converted to a reference pattern can furthermore be measured at several different frequencies in order to obtain different reference patterns.

Figure 2A:
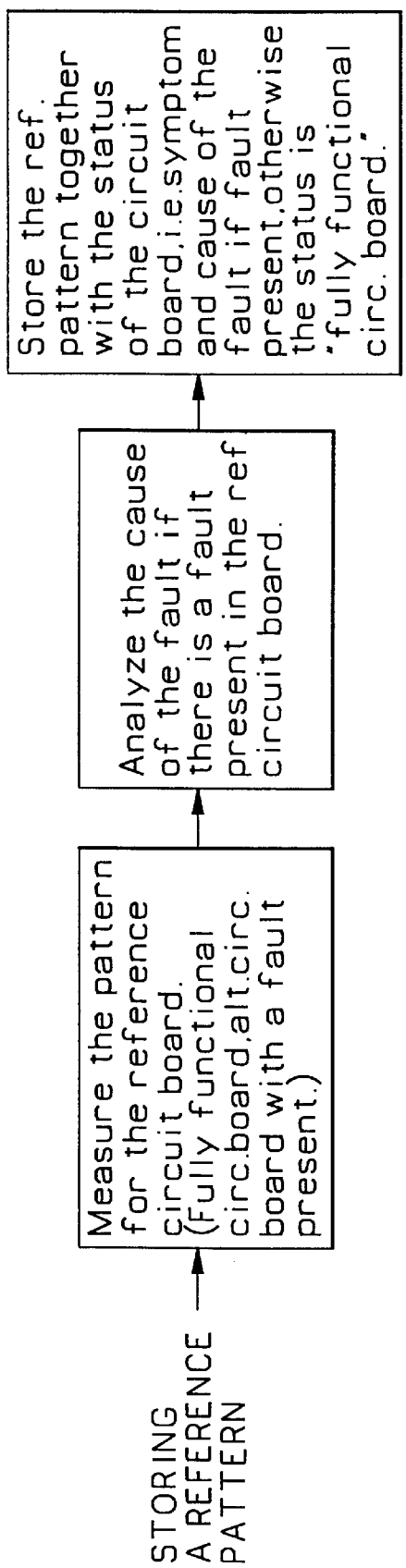

FIG. 2a shows how a reference pattern can be stored. The pattern of the reference circuit board is first measured, for example by measuring the E-field of the reference circuit board, and if there is a fault present on the reference circuit board, the cause of the fault is analyzed either manually, automatically or through a combination of the two. Subsequently, the reference pattern is stored together with the status of the circuit board, i.e. the symptom and the cause of the fault if a fault is present in the circuit board, otherwise the status of the circuit board is that it is functional.

FIG. 2b shows how the actual circuit board test can be carried out. One way of testing a circuit board might be to first measure the circuit board which is to be tested in a production test, where specific parameters are measured depending on what is intended to be measured on the circuit board. Following this, a decision can be made regarding whether there is a fault present or not on the circuit board.

If a fault is present a test pattern is generated, for example based on the E-field of the circuit board which is tested, and the test pattern is compared to the stored reference patterns by means of a numerical method in order to estimate the probable cause of a fault. When the estimate is finished, different reference patterns with causes and symptoms of faults and to which degree the reference pattern matches the test pattern are displayed. If the reference patterns are not sufficiently similar to the test pattern, this test pattern can be stored in the same way which has been described with reference to FIG. 2a. The word sufficient should here be taken to mean within a certain margin, which the operator can set by himself. If the reference patterns are sufficiently similar to the test pattern the circuit board which has been tested can be repaired using one or several steps which the reference pattern suggests or refers to. The circuit board is finally tested again in the production test in order to check whether there is a fault present in the board or not.

Variants of the test which is shown in FIG. 2b might be for example to start at points 1 or 2 instead, and in this way in some cases obtain a more rapid test compared to a production test, in order to decide whether a board is functioning or not. If the test starts at 1 instead of at "TEST", the amount of steps in the measurement will thus decrease, and the speed of the test will increase. A precondition for point 2 is that the circuit board which is tested has been repaired. The reason that the speed of the test in some cases can increase by starting at point 2 is that the amount of faults on the circuit board which is tested can be minimized before the repaired test circuit board is once again measured in the production test.

Other embodiments of this test might be to add and use a history data base with faults of different kinds during the latest period of time. In this way the most probable cause of a fault can be identified, based on similarities in pattern and the frequency of a fault.

If there are several reference patterns which are similar to the test pattern, and the reference pattern which best matches the test pattern does not give a result in a repair, the reference pattern which gives the second best similarity to the test pattern can be used. In this way a result can be obtained iteratively, i.e. by repeating a test with the subsequent reference pattern one or several times. The reference patterns can be based on an average of a plurality of boards with similar or equal status.

In order to test a circuit board, a measurement can thus be made of one or several test signals on a circuit board 60 which is to be tested by means of a fixture 40 equipped with one or several measuring probes 50 which are connected to said circuit board 60 which is to be tested. The test signal can then be transmitted by means of said measuring probes 50 to an analyzer 10,30 where said analyzer 10,30 first analyzes said test signal at one frequency and then converts said test signal to a test pattern. The analyzer 10,30 in this case, for reasons of simplicity, consists both of a spectrum analyzer 30, a GPIB interface (not shown) and a computer 10. Following this, the test pattern is compared to the reference pattern, where the patterns which are stored in a memory 20 can consist of different values which represent different levels of signals, and where the comparison between the values in said test pattern and in said reference pattern is made in a relative manner. The test pattern can of course be compared to several different reference patterns. The memory 20 can be connected either internally or externally in connection to or on the analyzer 10,30. The information regarding the condition of the circuit board 60 which is tested, which is obtained in the comparison with the reference pattern is transmitted to an output unit. The output unit can for example consist of a display, a monitor or some similar means for visualisation. The signals which are converted to a test pattern can furthermore be measured at several different frequencies, in order to be compared to different reference patterns.

Although the shown embodiments of the present invention have been described in detail with reference to the appended figures it must be realized that the invention is not limited to these specific embodiments, and that variations or modifications can be made by a man skilled in the field without deviating from the scope which is defined by the patent claims. For example, other similar estimates or improvements of the estimates which have been mentioned can be applied to the present invention.

We claim:

1. A method for testing circuit boards (60) which method comprises the following steps for creating a reference pattern:

a1) measuring at least one reference signal on a reference circuit board (60) by means of at least one measuring probe (50) which is connected to said circuit board (60), b1) transmitting the reference signal by means of said measuring probe (50) to an analyzer (10,30), c1) in which said analyzer (10,30) first analyzes said reference signal at at least one frequency and then converts said reference signal to a reference pattern, d1) registering said reference pattern in at least one memory (20) which is connected to said analyzer (10,30), and which method further comprises the following steps for testing a circuit board which is to be tested (60):

a2) measuring at least one test signal on a circuit board (60) which is to be tested by means of at least one measuring probe (50) which is connected to said circuit board (60) which is to be tested, b2) transmitting the test signal by means of said measuring probe (50) to an analyzer (10,30), c2) where said analyzer (10,30) first analyzes said test signal at at least one frequency and then converts said test signal to a test pattern, d2) comparing said test pattern with said reference pattern, in which the reference pattern and the test pattern are characterized by separate sets of values, characterized in that the values of the test pattern are compared with the set of values of the reference pattern in order to estimate the difference between the reference pattern and the test pattern.

2. Method according to claim 1, characterized in that said memory (20) further comprises information regarding the condition of the reference circuit board (60).

3. Method according to claim 2, characterized in that said information comprises symptoms and/or causes of faults.

4. Method according to claim 2, characterized in that said information is transmitted to an output unit.

5. Method according to claim 1, characterized in that said reference pattern consists of an average from a plurality of circuit boards.

6. Method according to claim 1, characterized in that said signals are measured at a plurality of different frequencies.

7. Method according to claim 1, characterized in that said measuring probe is a field probe and/or a galvanic probe.

8. Method according to claim 1, characterized in that said steps for creating a reference pattern is repeated on different reference boards (60), and a plurality of reference patterns is obtained which is stored in said memory (20).

9. Method according to claim 8, characterized in that said test pattern is compared with different reference patterns.

10. Method according to claim 9, characterized in that the method can be carried out iteratively.

11. Method according to claim 1, characterized in that said signals are dynamical.

12. Method according to claim 1, characterized in that said memory (20) is arranged either internally or externally on said analyzer (10,30).

13. An arrangement for testing circuit boards (60), which arrangement comprises the following components for creating a reference pattern or a test pattern:

1) at least one measuring probe (50) which is connected to said circuit board (60) for measuring at least one reference signal or test signal on a reference circuit board or a circuit board (60) which is to be tested, 2) an analyzer (10,30) which is connected to said measuring probe (50) in order to transmit the reference signal or test signal, where said analyzer (10,30) first analyzes said reference signal or the test signal at one frequency, and then converts said reference signal or the test signal to a reference pattern respectively a test pattern, 3) at least one memory (20) which is connected to said analyzer (10,30) in order to register said reference pattern or test pattern, in which said memory (20) is arranged with one or several reference patterns during a test of a circuit board (60), where the reference patterns comprise a plurality of different sets of values, and in which the reference pattern comprises a set of values, characterized in that said arrangement is equipped with means for estimating the difference between one of the reference patterns and the test pattern, in order to compare the values of the test pattern with one or several of the different sets of values of the reference pattern.

* * * * *